(12) United States Patent
Rho

(10) Patent No.: US 9,379,009 B2
(45) Date of Patent: Jun. 28, 2016

(54) INTERCONNECTION STRUCTURES IN A SEMICONDUCTOR DEVICE AND METHODS OF MANUFACTURING THE SAME

(71) Applicant: SK hynix Inc., Icheon-si Gyeonggi-do (KR)

(72) Inventor: Il Cheol Rho, Icheon-si (KR)

(73) Assignee: SK hynix Inc., Icheon-si, Gyeonggi-do (KR)

(*) Notice: Subject to any disclaimer, the term of this patent is extended or adjusted under 35 U.S.C. 154(b) by 0 days.

(21) Appl. No.: 14/626,135

(22) Filed: Feb. 19, 2015

(65) Prior Publication Data

US 2015/0179519 A1 Jun. 25, 2015

Related U.S. Application Data

(62) Division of application No. 13/586,985, filed on Aug. 16, 2012, now abandoned.

(30) Foreign Application Priority Data

Feb. 13, 2012 (KR) ........................ 10-2012-0014459

(51) Int. Cl.
*H01L 21/768* (2006.01)
*H01L 23/532* (2006.01)
*H01L 21/02* (2006.01)
*H01L 21/311* (2006.01)
*H01L 21/3205* (2006.01)
*H01L 21/324* (2006.01)

(52) U.S. Cl.
CPC ...... *H01L 21/76879* (2013.01); *H01L 21/0217* (2013.01); *H01L 21/02164* (2013.01); *H01L 21/02274* (2013.01); *H01L 21/31111* (2013.01); *H01L 21/324* (2013.01); *H01L 21/32053* (2013.01); *H01L 21/7682* (2013.01); *H01L 21/76802* (2013.01); *H01L 21/76831* (2013.01); *H01L 21/76846* (2013.01); *H01L 21/76852* (2013.01); *H01L 21/76855* (2013.01); *H01L 21/76885* (2013.01); *H01L 21/76897* (2013.01); *H01L 23/53238* (2013.01); *H01L 21/76843* (2013.01); *H01L 2924/0002* (2013.01)

(58) Field of Classification Search
CPC ...................... H01L 21/7682; H01L 21/76807
See application file for complete search history.

(56) References Cited

U.S. PATENT DOCUMENTS 6,214,731 B1 * 4/2001 Nogami ............ H01L 21/76843 257/E21.584
2002/0127810 A1 * 9/2002 Nakamura ........ H01L 27/10852 438/296

(Continued)

*Primary Examiner* — Thao X Le
*Assistant Examiner* — Geoffrey Ida
(74) *Attorney, Agent, or Firm* — William Park & Associates Ltd.

(57) ABSTRACT

Methods of fabricating interconnection structures of a semiconductor device are provided. The method includes, inter alia: forming a first insulation layer on a semiconductor substrate, forming a mold layer having trenches on the first insulation layer, forming a sidewall protection layer including a first metal silicide layer on sidewalls of the trenches, forming second metal lines that fill the trenches, forming upper protection layers on the second metal lines, removing the mold layer after formation of the upper protection layers to provide gaps between second metal lines, and forming a second insulation layer in the gaps and on the upper protection layers. The second insulation layer is formed to include air gaps between the second metal lines. Related interconnection structures are also provided.

10 Claims, 7 Drawing Sheets

(56) References Cited

U.S. PATENT DOCUMENTS

| | | | | |
|---|---|---|---|---|
| 2004/0126997 A1* | 7/2004 | Ning | ............ | H01L 21/76807 438/484 |
| 2005/0275042 A1* | 12/2005 | Hwang | ............ | H01L 29/4236 257/401 |
| 2006/0211235 A1* | 9/2006 | Usami | ............ | H01L 21/7682 438/618 |

* cited by examiner

INTERCONNECTION STRUCTURES IN A SEMICONDUCTOR DEVICE AND METHODS OF MANUFACTURING THE SAME

CROSS-REFERENCES TO RELATED APPLICATIONS

The present application claims priority under 35 U.S.C 119(a) to Korean Application No. 10-2012-0014459, filed on Feb. 13, 2012, in the Korean Intellectual Property Office, which is incorporated herein by reference in its entirety set forth in full.

BACKGROUND

1. Field of Invention

Embodiments of the present disclosure relate generally to semiconductor devices and methods of manufacturing the same and, more particularly, to interconnection structures in a semiconductor device and methods of manufacturing the same.

2. Related Art

For higher integration of semiconductor devices, widths and spaces of interconnection line patterns in the semiconductor devices need to be continually reduced for increased pattern density of the semiconductor devices. This would worsen the problems related to parasitic capacitance between the adjacent interconnection line patterns and electrical resistance of the interconnection line patterns.

Recently, high performance semiconductor memory devices such as fast dynamic random access memory (DRAM) devices and/or fast NAND-type flash memory devices are quite common in the semiconductor industry. In order to allow high performance semiconductor memory devices, RC delay of the interconnection line patterns constituting the semiconductor memory devices should be reduced. For example, a copper layer having a relatively low electrical resistance has been widely employed to form the interconnection lines such as bit lines of high performance semiconductor memory devices. In addition, various low-k dielectric layers have been used for insulation disposed between the adjacent interconnection lines.

When large and excessive current flows through an interconnection line such as a metal line, an electro-migration phenomenon or a stress-migration phenomenon may occur due to electrical or mechanical stress. The electro-migration phenomenon and/or the stress-migration phenomenon may require a bridge between the adjacent interconnection lines. For example, when the interconnection lines are formed of a copper layer, and a low-k dielectric layer is formed between the adjacent copper lines, it may be difficult to suppress the migration of the copper atoms in the copper lines with the low-k dielectric layer. Thus, a copper bridge may need to be formed between the adjacent copper lines. Otherwise without this bridge or some other equivalent, the copper atoms in the copper lines may migrate to contaminate the semiconductor device and degrade the reliability of the semiconductor device.

A barrier layer has been widely used to suppress the migration of the metal atoms in the metal lines. For example, a metal nitride layer may be used as a copper barrier layer surrounding the copper lines. Further, a nitride layer or a carbide layer may be used as a capping layer formed on top surfaces of the copper lines to suppress the electro-migration phenomenon.

SUMMARY

Various embodiments are directed to interconnection structures in a semiconductor device and methods of manufacturing the same.

According to an embodiment, a method of manufacturing an interconnection structure of a semiconductor device includes forming a first insulation layer on a semiconductor substrate, forming a mold layer having trenches on the first insulation layer, forming a sidewall protection layer including a first metal silicide layer on sidewalls of the trenches, forming second metal lines that fill the trenches, forming upper protection layers on the second metal lines, removing the mold layer after formation of the upper protection layers to provide gaps between second metal lines, and forming a second insulation layer in the gaps and on the upper protection layers. The second insulation layer is formed to include air gaps between the second metal lines.

According to a variation of an embodiment, a method of manufacturing an interconnection structure of a semiconductor device includes forming a first insulation layer on a semiconductor substrate, forming a silicon mold layer having trenches on the first insulation layer, forming a first metal layer covering sidewalls of the trenches, reacting the first metal layer with the silicon mold layer to form first metal silicide layers acting as sidewall protection layers, forming second metal lines that fill the trenches, forming upper protection layers on the second metal lines, removing the silicon mold layer after formation of the upper protection layers to provide gaps between second metal lines, and forming a second insulation layer in the gaps and on the upper protection layers. The second insulation layer is formed to include air gaps between the second metal lines.

According to another variation of an embodiment, a method of manufacturing an interconnection structure of a semiconductor device includes forming a first insulation layer on a semiconductor substrate, forming a mold layer having trenches on the first insulation layer, forming sidewall spacers including a silicon layer on sidewalls of the trenches, forming a first metal layer covering the sidewall spacers, reacting the first metal layer with the sidewall spacers to form first metal silicide layers acting as sidewall protection layers, forming second metal lines that fill the trenches, forming upper protection layers on the second metal lines, removing the mold layer after formation of the upper protection layers to provide gaps between second metal lines, and forming a second insulation layer in the gaps and on the upper protection layers. The second insulation layer is formed to include air gaps between the second metal lines.

According to yet another variation of an embodiment, an interconnection structure of a semiconductor device includes a first insulation layer on a semiconductor substrate, second metal lines on the first insulation layer opposite to the semiconductor substrate, first metal silicide layers disposed on sidewalls of the second metal lines to act as sidewall protection layers, upper protection layers on top surfaces of the second metal lines, and a second insulation layer including air gaps between the second metal lines and extending onto the upper protection layers.

According to a variation of an embodiment, an interconnection structure of a semiconductor device includes a first insulation layer on a semiconductor substrate, copper lines on the first insulation layer opposite to the semiconductor substrate, cobalt silicide layers disposed on sidewalls of the copper lines to act as sidewall protection layers, upper protection layers on top surfaces of the copper lines, and a second insulation layer including air gaps between the copper lines and extending onto the upper protection layers.

In another variation of an embodiment, forming the second metal lines may include forming a copper layer that fills the trenches.

In yet another variation of an embodiment, the first metal silicide layer may be formed to include a cobalt silicide layer.

In yet another variation of an embodiment, the first metal silicide layer may be formed to include a tantalum silicide layer.

BRIEF DESCRIPTION OF THE DRAWINGS

Embodiments of the inventive concept will become more apparent in view of the attached drawings and accompanying detailed description.

DETAILED DESCRIPTION OF THE EMBODIMENTS

Figure 1:
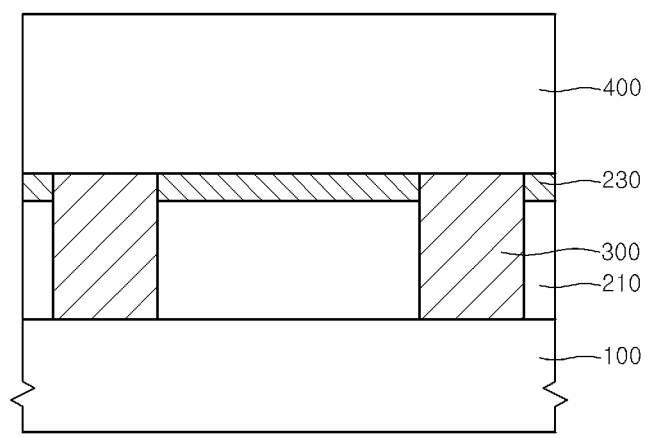
FIGS. 1 to 9 are cross sectional views illustrating an interconnection structure of a semiconductor device and a method of fabricating the same according to an embodiment.

Various embodiments are described below with reference to the accompanying drawings. Many different forms and embodiments are possible without deviating from the spirit and teachings of this disclosure and so the disclosure should not be construed as limited to the various embodiments set forth herein. Rather, these various embodiments are provided so that this disclosure will be thorough and complete, and will convey the scope of the disclosure to those skilled in the art. In the drawings, the sizes and relative sizes of layers and regions may be exaggerated for clarity. The same reference numerals or the same reference designators denote the same elements throughout the specification.

Various embodiments are described herein with reference to cross-sectional views that are schematic illustrations of idealized various embodiments (and intermediate structures). As such, variations of the shapes of the illustrations as a result of manufacturing techniques and/or tolerances for example, are to be expected. Thus, various embodiments may not be construed as limited to the particular shapes of regions illustrated herein but may be construed to include deviations in shapes that result, for example, from manufacturing.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "has," "having," "comprises," "comprising," "includes," and/or "including," when used herein, specify the presence of stated features, steps, operations, elements, and/or components, but do not preclude the presence or addition of one or more other features, steps, operations, elements, components, and/or groups thereof.

It will be understood that when an element is referred to as being "coupled," "connected," "responsive" to, or "on" another element, it can be directly coupled, connected, responsive to, or on the other element, or intervening elements may also be present. In contrast, when an element is referred to as being "directly coupled," "directly connected," "directly responsive" to, or "directly on" another element, there are no intervening elements present. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another. Thus, a first element could be termed a second element without departing from the teachings of the present embodiments.

Unless otherwise defined, all terms (including technical and scientific terms) used herein have the same meaning as commonly understood by one of ordinary skill in the art to which these embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The following various embodiments disclose an insulation layer having air gaps therein, which is disposed between metal interconnection lines of a semiconductor device. Further, the various embodiments disclose interconnection structures including a barrier layer (e.g., a metal silicide layer) between the insulation layer and the metal interconnection lines. According to the various embodiments, a parasitic capacitance between the interconnection lines of the semiconductor device may be reduced to improve the operation speed of the semiconductor device with reduced RC delay, and migration of metal atoms in the metal interconnection lines may be suppressed to enhance the reliability of the metal interconnection lines.

In the event that the insulation layer having air gaps therein is formed between copper lines, the parasitic capacitance between the copper lines may be lowered to reduce the RC delay of electrical signals that flows through the copper lines. In addition, when a protection layer including a cobalt silicide ($CoSi_x$) layer is formed on at least sidewalls of the copper lines, the cobalt silicide ($CoSi_x$) layer may protect the copper lines from being oxidized due to an external environment and from being damaged by an etching process for forming the air gaps. The cobalt silicide ($CoSi_x$) layer has been widely known as a material having a higher oxidation resistant property and a higher etch (or corrosion) resistant property than a titanium nitride (TiN) layer or a titanium silicide ($TiSi_x$) layer. Further, the cobalt silicide ($CoSi_x$) layer has been widely known as an excellent barrier layer suppressing the migration or the diffusion of copper atoms in the copper lines. Accordingly, the interconnection structure including the copper lines and the cobalt silicide ($CoSi_x$) layer may efficiently improve the reliability and the operation speed of the semiconductor device.

FIGS. 1 to 9 are cross sectional views illustrating an interconnection structure of a semiconductor device according to an embodiment and a method of fabricating the same.

Referring to FIG. 1, a first insulation layer 210 may be formed on a semiconductor substrate 100. The first insulation layer 210 may act as an interlayer insulation layer including a silicon oxide ($SiO_2$) layer, a silicon nitride ($Si_3N_4$) layer, or a silicon carbide (SiC) layer. An etch stop layer 230 may be additionally formed on the first insulation layer 210. The etch stop layer 230 may protect the first insulation layer 210 from being etched during a subsequent etching process. The etch stop layer 230 may be formed of an insulation layer having an etch selectivity complementary to the first insulation layer 210. For example, when the first insulation layer 210 is formed to include a silicon oxide layer, the etch stop layer 230 may be formed to include a silicon nitride layer. In the event that the first insulation layer 210 is formed of a silicon nitride layer, a process for forming the etch stop layer 230 may be omitted.

Cell transistors (not shown) constituting memory cells of a DRAM device or a NAND-type flash memory device may be formed in the semiconductor substrate 100. In case of the DRAM device, each of the cell transistors may be formed to include a buried gate disposed in the semiconductor substrate 100, thereby contributing to shrinkage of the dimensions of the DRAM device. In the event that the cell transistors are formed in the semiconductor substrate 100, the first insulation layer 210 may act as an interlayer insulation layer that electrically insulates the cell transistors from interconnection lines such as bit lines.

Contact plugs 300 may be formed to penetrate the etch stop layer 230 and the first insulation layer 210, thereby contacting the semiconductor substrate 100. That is, the contact plugs 300 may be formed to electrically connect drain regions of the cell transistors to interconnection lines, for example, bit lines. The contact plugs 300 may be formed to include a conductive layer, for example, a doped polysilicon layer. In various embodiments, the contact plugs 300 may be formed to include a relatively low resistive metal layer such as a tungsten layer to improve the operation speed of the semiconductor device and to reduce contact resistance between the contact plugs 300 and bit lines.

The contact plugs 300 may be formed by patterning the etch stop layer 230 and the first insulation layer 210 to form contact holes, depositing a tungsten layer in the contact holes and on the etch stop layer 230, and planarizing the tungsten layer using a chemical mechanical polishing (CMP) process to expose a top surface of the etch stop layer 230. During planarization of the tungsten layer, the etch stop layer 230 may protect the first insulation layer 210 from being etched and/or damaged.

Subsequently, a mold layer 400 may be formed on the contact plugs 300 and the etch stop layer 230. The mold layer 400 may be formed to provide pattern shapes of interconnection lines such as bit lines. The mold layer 400 may correspond to a sacrificial layer which is removed in a subsequent process. The mold layer 400 may be formed of a silicon layer, for example, a polysilicon layer.

Figure 2:
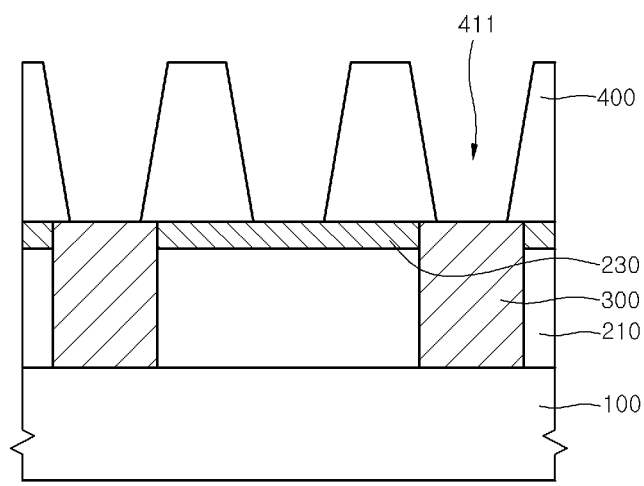

Referring to FIG. 2, the mold layer 400 may be patterned using a lithography process and an etching process to form trenches 411 exposing the contact plugs 300 and some portions of the etch stop layer 230. The trenches 411 may provide spaces in which metal lines such as bit lines are formed. That is, the trenches 411 may correspond to line-shaped grooves. The trenches 411 may be formed to have vertical sidewall profiles. Alternatively, the trenches 411 may be formed to have sloped sidewall profiles. For example, the trenches 411 may be formed to have negative sloped sidewall profiles such that an upper width of each of the trenches 411 is greater than a lower width thereof. In contrast, the trenches 411 may be formed to have positive sloped sidewall profiles such that an upper width of each of the trenches 411 is less than a lower width thereof.

In some embodiments, the trenches 411 may be formed to have negative sloped sidewall profiles or vertical sidewall profiles. This is for improving a filling characteristic of a conductive layer which is formed in the trenches 411 in a subsequent process. The trenches 411 may be formed when the etch stop layer 230 is exposed, and the etch stop layer 230 may protect and/or suppress the first insulation layer 210 from being etched or damaged during formation of the trenches 411.

Figure 3:
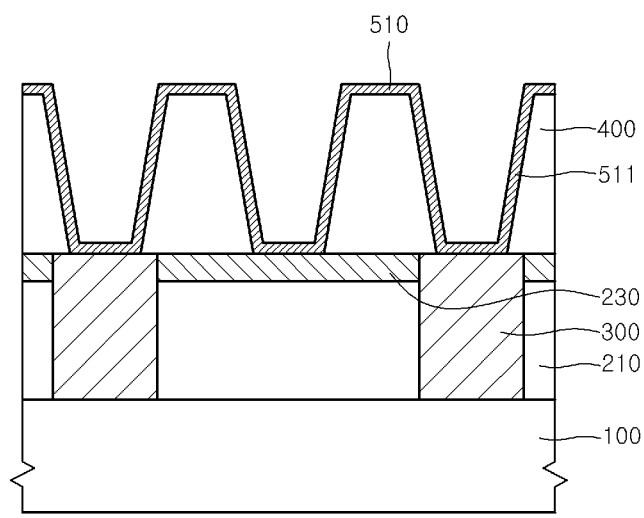

Referring to FIG. 3, a first metal layer 510 may be conformably formed in the trenches 411 and on the mold layer 400. The first metal layer 510 may be formed of a different metallic material from a second metal layer that is formed to fill the trenches 411 in a subsequent process. For example, the first metal layer 510 may be formed to include cobalt (Co) or a cobalt alloy. When the second metal layer is formed of a copper layer or a copper containing layer, the first metal layer 510 may be formed of a cobalt (Co) layer which is effective in suppression of migration and/or diffusion of copper atoms in the second metal layer. Cobalt atoms in the cobalt layer may strongly combine with copper atoms in the copper lines, thereby suppressing migration of the copper atoms. Alternatively, the first metal layer 510 may be formed of a tantalum (Ta) layer to suppress migration of copper atoms. However, it may be more effective to form the first metal layer 510 with a cobalt layer in terms of suppression of copper migration, silicidation of the first metal layer 510, and an etch (or corrosion) resistant property of the first metal layer 510 during selective removal of the mold layer 400.

In the event that the first metal layer 510 is formed of a cobalt layer, the first metal layer 510 may be formed using a chemical vapor deposition (CVD) process. In such a case, the first metal layer 510 may be conformably and/or uniformly formed on bottom surfaces and sidewalls of the trenches 410. When the contact plugs 300 are formed to include a tungsten layer, and the trenches 411 are filled with a copper layer in a subsequent process, cobalt atoms in the first metal layer 510 may react on tungsten atoms in the contact plugs 300 to form a cobalt-tungsten alloy layer on the contact plugs 300. The cobalt-tungsten alloy layer may suppress copper atoms in the copper layer from being diffused and/or migrated into the contact plugs 300. Thus, in some embodiments, the first metal layer 510 may be formed of a cobalt layer.

Figure 4:
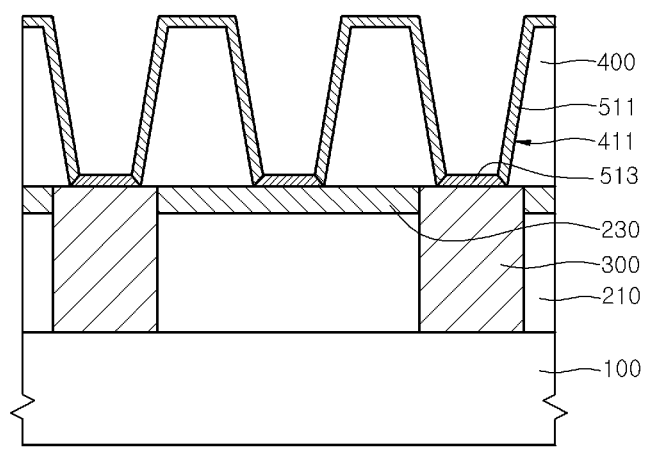

Referring to FIG. 4, the substrate including the first metal layer 510 may be annealed to form a sidewall protection layer 511 including a first metal silicide layer, for example, a cobalt silicide layer. The sidewall protection layer 511 may be formed by reaction of the first metal layer 510 (e.g., a cobalt layer) and the mold layer 400 (e.g., a silicon layer). The first metal layer 510 and the mold layer 400 may react on each other at a temperature of about 450° C. to about 800° C. to form the sidewall protection layer 511. In an embodiment, the sidewall protection layer 511 may be formed using a rapid thermal annealing (RTA) process.

Even though the silicidation process is performed, portions of the first metal layer 510 on the contact plugs 300 may not react on the mold layer 400 to still remain without silicidation thereof. These unreacted portions of the first metal layer 510 may act as bottom barrier layers 513. The bottom barrier layers 513 may suppress copper atoms of copper lines formed in the trenches 411 from being migrated and/or diffused in a subsequent process. In the event that the first metal layer 510 is formed of a tantalum layer, the tantalum layer may react on the mold layer 400 to form a tantalum silicide layer corresponding to the sidewall protection layer 511 during the silicidation process. The sidewall protection layer 511 may be formed on sidewalls of the trenches 411 and even on a top surface of the mold layer 400.

Since the mold layer 400 is formed to include a silicon layer such as a polysilicon layer, the first metal silicide layer corresponding to the sidewall protection layer 511 may be formed to be self-aligned with sidewalls of the trenches 411 in which copper lines are formed in a subsequent process. Accordingly, the sidewall protection layer 511 may surround the copper lines which are formed in a subsequent process.

Figure 5:
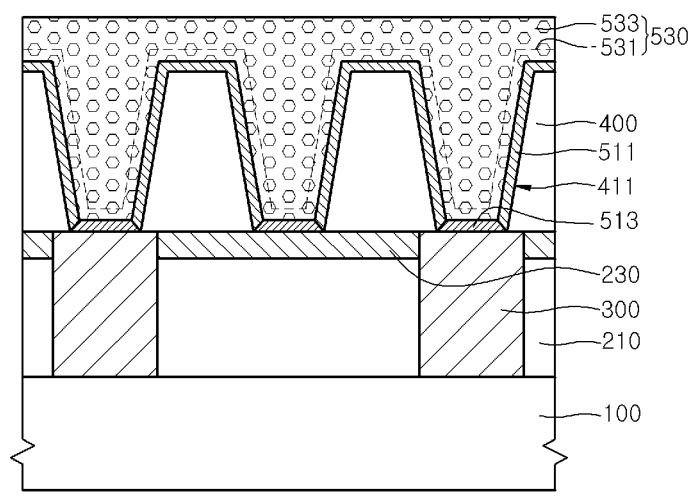

Referring to FIG. 5, a second metal layer 530 may be formed to fill the trenches 411 on the sidewall protection layer 511. The second metal layer 530 may be used as interconnection lines such as bit lines. Thus, the second metal layer 530 may be formed to include a low resistive layer, for example, a copper layer or a copper alloy layer. In an embodiment, the second metal layer 530 may be formed by depositing a copper seed layer 531 on the sidewall protection layer 511 using a sputtering process and by forming a copper layer 533 on the copper seed layer 531 using an electro-chemical deposition process such as an electro-plating technique. The copper layer 533 may be formed using an electroless plating process, but not limited thereto. For example, the copper layer 533 may be formed using a chemical vapor deposition (CVD) process.

Figure 6:
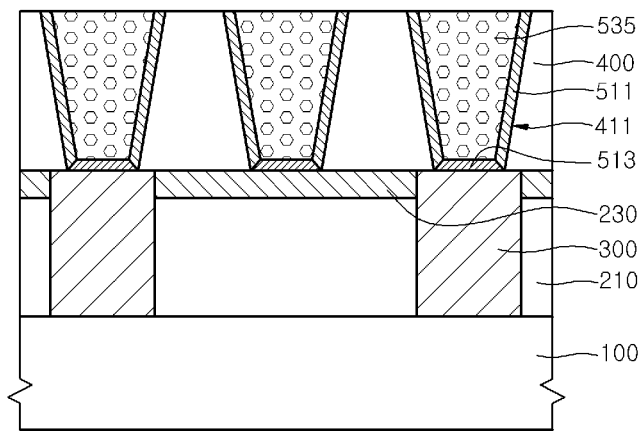

Referring to FIG. 6, the second metal layer 530 may be planarized using a chemical mechanical polishing process to form a plurality of second metal lines 535 in the trenches 411. The planarization process applied to the second metal layer 530 may be performed until a top surface of the mold layer 400 may be exposed, thereby separating the second metal lines 535 from each other. Thus, the sidewall protection layer 511 may cover and protect sidewalls of the second metal lines 535, for example, copper lines. In regards to the sidewall protection layer 511, for example, a cobalt silicide layer may suppress migration of copper atoms in the second metal lines 535 (e.g., copper lines), thereby preventing the adjacent second metal lines 535 from being electrically connected to each other. The sidewall protection layer 511 may be formed of a tantalum silicide layer instead of a cobalt silicide layer. That is, a tantalum silicide layer may also suppress migration of copper atoms in the second metal lines 535 (e.g., copper lines).

Figure 7:
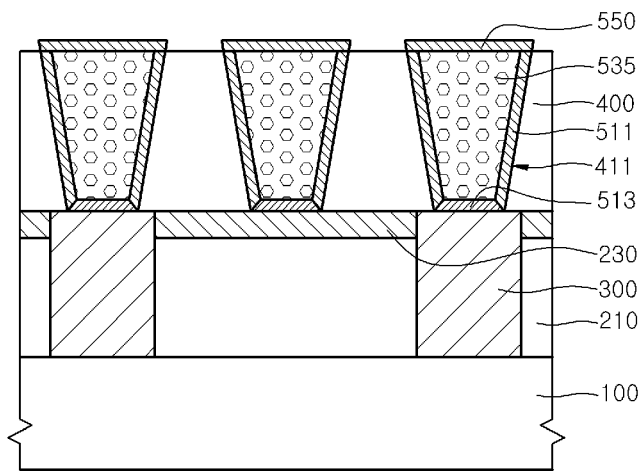

Referring to FIG. 7, upper protection layers 550 may be formed on the second metal lines 535. The upper protection layers 550 may be formed of a cobalt layer or a cobalt alloy layer. The upper protection layers 550 may be formed by selectively depositing a cobalt layer or a cobalt alloy layer on the second metal lines 535. A cobalt alloy layer may include a cobalt-tungsten-phosphorus (CoWP) alloy layer, a cobalt-tungsten (CoW) alloy layer, a cobalt-tungsten-boron (CoWB) alloy layer, or a cobalt-tungsten-phosphorus-boron (CoWPB) alloy layer. The upper protection layers 550 may also suppress migration of copper atoms in the second metal lines 535 (e.g., copper lines) and may act as an oxidation barrier layer preventing the second metal lines 535 (e.g., copper lines) from being oxidized. In an embodiment, it may be more effective that the upper protection layers 550 are formed to include a cobalt-tungsten-phosphorus (CoWP) alloy layer in terms of advantageous suppression of copper migration and prevention of contamination of the copper lines. The upper protection layers 550 may be formed by selectively depositing a cobalt layer or a cobalt-tungsten-phosphorus (CoWP) alloy layer on the second metal lines 535 (e.g., copper lines) using a chemical vapor deposition (CVD) process. Consequently, the upper protection layers 550 can be formed even without use of any additional processes for separating the upper protection layers 550.

Figure 8:
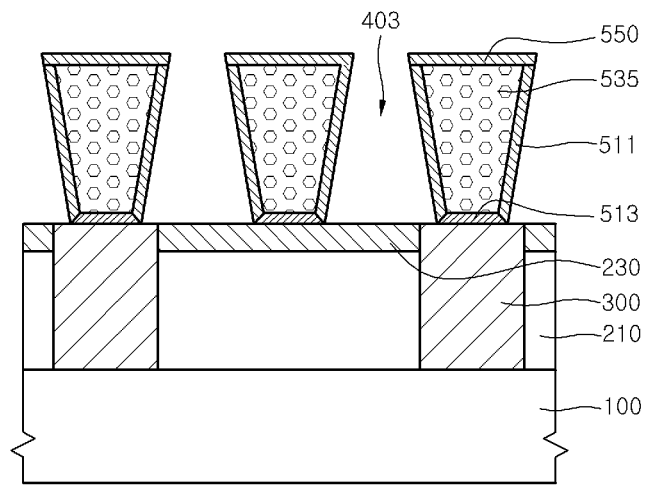

Referring to FIG. 8, the mold layer 400 may be selectively removed to provide empty gaps 403 between the second metal lines 535. The mold layer 400, for example, made of a polysilicon layer, may be removed to expose outer sidewall surfaces of the sidewall protection layers 511.

The mold layer 400, for example, made of a polysilicon layer, may have an etch selectivity with respect to the bottom barrier layers 513 (e.g., cobalt layers) and the sidewall protection layers 511 (e.g., cobalt silicide layers). Thus, when the mold layer 400 is removed, the bottom barrier layers 513 and the sidewall protection layers 511 may prevent the second metal lines 535 (e.g., copper lines) from being damaged and/or etched. Further, the bottom barrier layers 513, the sidewall protection layers 511, and the upper protection layers 550 may not be lost and/or etched during removal of the mold layer 400.

When the mold layer 400 is formed of a polysilicon layer, the mold layer 400 may be selectively removed using a wet etching process that employs a mixture of nitric acid ($HNO_3$), hyfrofluoric acid (HF), and de-ionized water, or a solution including ammonium hydroxide ($NH_4OH$) as a wet etchant. A cobalt silicide ($CoSi_x$) layer has been widely known as a material having an excellent oxidation resistant property and an excellent etch (or corrosion) resistant property. Thus, in the event that the sidewall protection layers 511 are formed of a cobalt silicide ($CoSi_x$) layer, the sidewall protection layers 511 may not be damaged during removal of the mold layer 400. As described above, the mold layer 400 may be selectively removed using a wet etching process. However, the wet etching process is merely an example of suitable etching processes for removing the mold layer 400. That is, the mold layer 400 may be selectively removed using any etching processes that exhibit an etch selectivity of the mold layer 400 with respect to the bottom barrier layers 513, the sidewall protection layers 511, and the upper protection layers 550.

Figure 9:
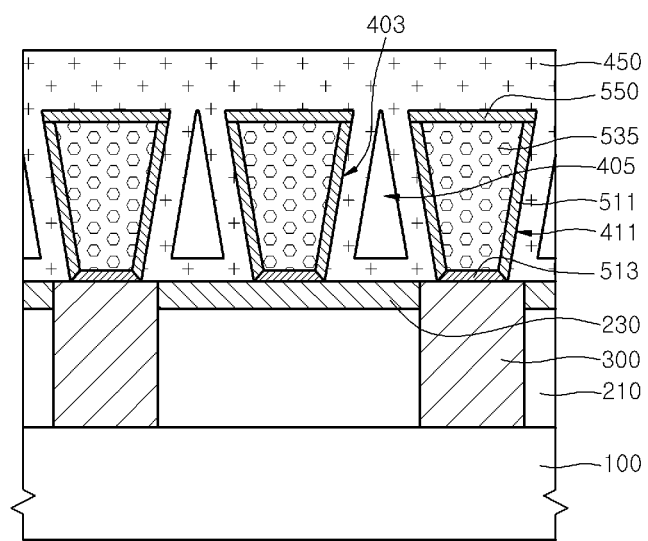

Referring to FIG. 9, a second insulation layer 450 may be formed on the second metal lines 535 to insulate the second metal lines 535 from each other. That is, the second insulation layer 450 may cover the upper protection layers 550 and the sidewall protection layers 511. The second insulation layer 450 may be formed, but not to completely fill the gaps 403 between the second metal lines 535. In other words, the second insulation layer 450 may be deposited to have air gaps 405 (e.g., empty spaces such as voids) between the second metal lines 535. In the event that a pitch size of the second metal lines 535 is reduced and the second insulation layer 450 is formed using a deposition technique exhibiting poor step coverage, the air gaps 405 may be more readily formed between the second metal lines 535.

In an embodiment, the second insulation layer 450 may be formed of a silicon oxide layer or a silicon nitride layer using a plasma enhanced chemical vapor deposition (PECVD) process that exhibits poor step coverage. In such a case, the second insulation layer 450 may be formed to include overhangs on upper corners of the second metal lines 535. Thus, the overhangs may contact each other before the gaps 403 between the second metal lines 535 are filled with the second insulation layer 450. Consequently, the air gaps 405 may be more readily formed between the second metal lines 535. In particular, when an upper width of each of the second metal lines 535 is greater than a lower width thereof, a size and/or a volume of each of the air gaps 405 may be increased. Therefore, as described with reference to FIG. 2, the trenches 411 may be formed to have negative sloped sidewall profiles such that an upper width of each of the trenches 411 is greater than a lower width thereof in order to increase the sizes of the air gaps 405.

Since the air gaps 405 are filled with air, the air gaps 405 may have a lower dielectric constant than the second insulation layer 450 formed of a silicon oxide layer or a silicon nitride layer. Thus, if the air gaps 405 are formed between the second metal lines 535, a parasitic capacitance between the second metal lines 535 may be effectively reduced to improve the operation speed of the semiconductor device.

The second metal lines 535, the sidewall protection layers 511, the upper protection layers 550, and the second insulation layer 450 including the air gaps 405 therein may constitute an interconnection structure, and the interconnection structure may be realized in various forms.

FIGS. 10 to 13 are cross sectional views illustrating an interconnection structure of a semiconductor device according to another embodiment and a method of fabricating the same.

Figure 10:
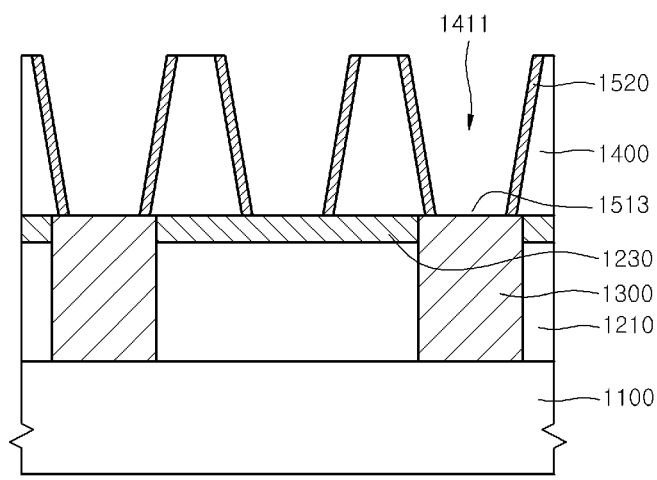
FIGS. 10 to 13 are cross sectional views illustrating an interconnection structure and a method of fabricating the same of a semiconductor device according to another embodiment.

Referring to FIG. 10, a first insulation layer 1210, contact plugs 1300, an etch stop layer 1230, a mold layer 1400 and trenches 1411 may be formed on a semiconductor substrate 1100 using the same and/or similar manners as described with reference to FIGS. 1 and 2. In the present embodiment, the mold layer 1400 may not be formed to include a silicon layer. For example, the mold layer 1400 may be formed of an insulation layer such as a silicon oxide layer, a silicon nitride layer, or a silicon carbide layer. Sidewall spacers 1520 may be then formed on the trenches 1411. The sidewall spacers 1520 may be formed to include a silicon layer which is required in a subsequent silicidation process. The sidewall spacers 1520 may be formed by depositing a silicon layer on the substrate having the trenches 1411 and anisotropically etching the silicon layer to expose the contact plugs 1300. Alternatively, the sidewall spacers 1520 may be formed to cover the bottom surfaces as well as the sidewalls of the trenches 1411 without application of the anisotropic etching process.

Figure 11:
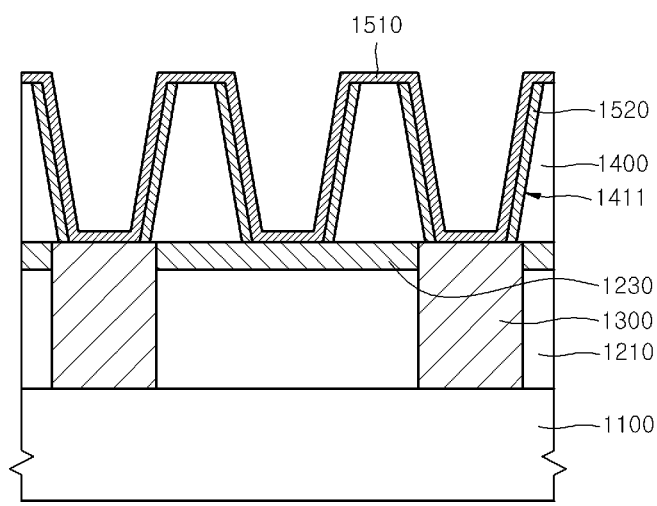

Referring to FIG. 11, a first metal layer 1510 may be conformably formed on the substrate including the sidewall spacers 1520, as described with reference to FIG. 3. However, while the first metal layer 510 illustrated in FIG. 3 is formed to directly contact the sidewalls of the mold layer 400 formed of a silicon layer (e.g., a polysilicon layer), the first metal layer 1510 may be formed to directly contact the sidewall spacers 1520 formed of a silicon layer (e.g., a polysilicon layer).

Figure 12:
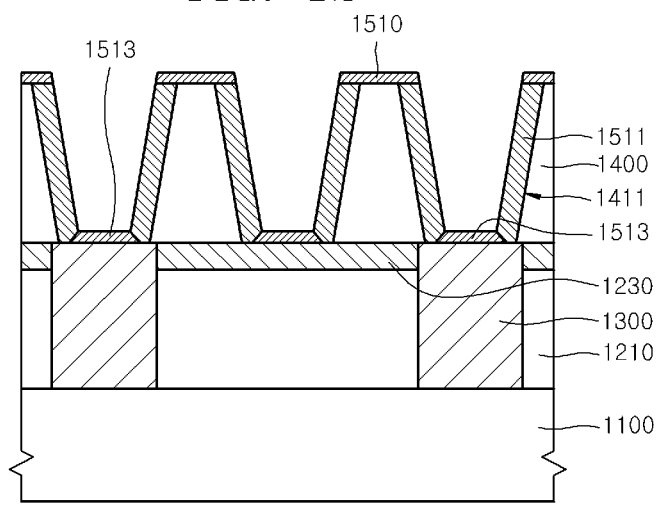

Referring to FIG. 12, the substrate including the first metal layer 1510 may be annealed using the same and/or similar manners as described with reference to FIG. 4, thereby forming sidewall protection layers 1511 on sidewalls of the trenches 1411. The sidewall protection layers 1511 may be formed to include a first metal silicide layer, for example, a cobalt silicide layer. The sidewall protection layers 1511 may be formed by reaction of the first metal layer 1510 (e.g., a cobalt layer) and the sidewall spacers 1520 (e.g., a silicon layer). During the silicidation process, portions of the first metal layer 1510 on the contact plugs 1300 may not react with the sidewall spacers 1520 to still remain without silicidation thereof. These unreacted portions of the first metal layer 1510 may act as bottom barrier layers 1513.

Figure 13:
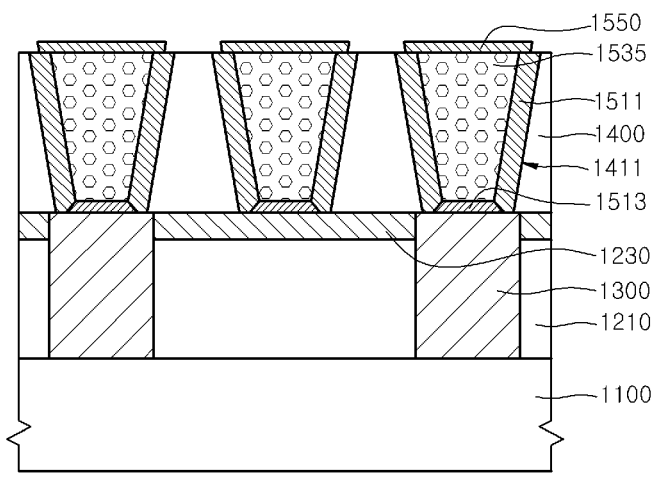

Referring to FIG. 13, second metal lines 1535 including copper may be formed to fill the trenches 1411 and upper protection layers 1550 may be formed on the second metal lines 1535. The second metal lines 1535 and the upper protection layers 1550 may be formed using the same and/or similar manners as described with reference to FIGS. 5 to 7. Although nor shown in the drawings, the mold layer 1400 may be then selectively removed, as described with reference to FIG. 8. According to the present embodiment, the mold layer 1400 may be formed of an insulation layer such as a silicon oxide layer or a silicon nitride layer, as described above. Thus, the mold layer 1400 may be selectively removed using an etching process that can selectively etch a silicon oxide layer or a silicon nitride layer. Subsequently, a second insulation layer (not shown) may be formed using the same and/or similar manners as described with reference to FIG. 9. As a result, air gaps may be formed in the second insulation layer between the second metal lines 1535, as described with reference to FIG. 9.

The embodiments of the inventive concept have been disclosed above for illustrative purposes. Those skilled in the art will appreciate that various modifications, additions and substitutions are possible, without departing from the scope and spirit of the inventive concept as disclosed in the accompanying claims.

What is claimed is:

1. A method of fabricating interconnection structures of a semiconductor device, the method comprising:
    forming a first insulation layer on a semiconductor substrate;
    forming a silicon mold layer having trenches on the first insulation layer;
    forming a first metal layer covering sidewalls of the trenches;
    reacting the first metal layer with the silicon mold layer to form first metal silicide layers acting as sidewall protection layers;
    forming second metal lines that fill the trenches;
    forming upper protection layers on the second metal lines;
    removing the silicon mold layer after formation of the upper protection layers to provide gaps between second metal lines; and
    forming a second insulation layer in the gaps and on the upper protection layers,
    wherein the second insulation layer is formed to include air gaps between the second metal lines.

2. The method of claim 1, further comprising forming contact plugs that penetrate the first insulation layer to connect the semiconductor substrate to the second metal lines prior to formation of the silicon mold layer.

3. The method of claim 1, wherein forming the silicon mold layer includes:
    depositing a silicon layer on the first insulation layer; and
    patterning the silicon mold layer to form the trenches.

4. The method of claim 3, wherein forming the first metal layer includes forming a cobalt containing layer that directly contacts sidewalls of the trenches.

5. The method of claim 4, wherein the cobalt containing layer is formed by depositing a cobalt layer.

6. The method of claim 5, wherein the cobalt containing layer is formed to extend onto bottom surfaces of the trenches.

7. The method of claim 6, wherein forming the sidewall protection layers includes annealing the cobalt containing layer and the silicon mold layer to form cobalt silicide layers corresponding to the first metal silicide layers that cover the sidewalls of the trenches, and
    wherein portions of the cobalt containing layer on the bottom surfaces of the trenches remain without any reaction during formation of the cobalt silicide layers, thereby functioning as bottom barrier layers.

8. The method of claim 7, wherein annealing the cobalt containing layer and the silicon mold layer is performed using a rapid thermal annealing (RTA) process at a temperature of about 450° C. to about 800° C.

9. The method of claim 7, wherein removing the silicon mold layer is performed using a wet etching process that employs a mixture of nitric acid ($HNO_3$), hyfrofluoric acid (HF), and de-ionized water or a chemical solution including ammonium hydroxide ($NH_4OH$) as an etchant.

10. The method of claim 1, wherein forming the second metal lines includes forming copper layers that fill the trenches.

* * * * *